(12) United States Patent
Campardo et al.

(10) Patent No.: US 6,215,329 B1
(45) Date of Patent: Apr. 10, 2001

(54) OUTPUT STAGE FOR A MEMORY DEVICE AND FOR LOW VOLTAGE APPLICATIONS

(75) Inventors: Giovanni Campardo, Bergamo; Stefano Zanardi, Seriate; Andrea Ghilardelli, Cinisello Balsamo, all of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 08/899,228

(22) Filed: Jul. 23, 1997

(30) Foreign Application Priority Data

Jul. 24, 1996 (EP) .................................................. 96830411

(51) Int. Cl.[7] ................... H03K 19/094; H03K 19/0175
(52) U.S. Cl. ............................... 326/88; 326/86; 327/112; 327/390
(58) Field of Search ................................ 326/88, 83, 82, 326/86, 17, 26, 27; 365/230.06, 230.08, 189.01, 189.11; 327/112, 390, 391, 589

(56) References Cited

U.S. PATENT DOCUMENTS

| | | | |
|---|---|---|---|
| 3,660,684 | * | 5/1972 | Padgett et al. .......................... 326/88 |
| 4,550,264 | * | 10/1985 | Takahaski et al. .................... 327/589 |
| 4,570,244 | | 2/1986 | Sud et al. ............................... 365/230 |
| 4,583,203 | | 4/1986 | Monk ..................................... 365/189 |
| 5,270,588 | | 12/1993 | Choi . |
| 5,493,245 | * | 2/1996 | Kao et al. ............................. 327/333 |
| 5,729,165 | * | 3/1998 | Lou et al. ............................. 327/112 |

FOREIGN PATENT DOCUMENTS

| | | | |
|---|---|---|---|
| 1520079 | * | 8/1978 | (DE) . |
| 0 647 944 | | 4/1995 | (EP) ................................ G11C/7/00 |
| 2 246 885 | | 2/1992 | (GB) ................................ G11C/7/00 |

\* cited by examiner

*Primary Examiner*—Michael Tokar
*Assistant Examiner*—Daniel D. Chang
(74) *Attorney, Agent, or Firm*—Wolf, Greenfield & Sacks, P.C.; James H. Morris; Theodore E. Galanthay

(57) ABSTRACT

The present invention relates to an output stage for an electronic memory device and for low supply-voltage applications and is the type comprising a final stage of the pull-up/pull-down type made up of a complementary pair of transistors inserted between a primary reference supply voltage and a secondary reference voltage and a voltage regulator for the control terminals of said transistors. The regulator is a voltage booster using at least one bootstrap capacitor to increase the current flowing in the final stage by boosting the voltage applied to said control terminals.

26 Claims, 6 Drawing Sheets

OUTPUT STAGE FOR A MEMORY DEVICE AND FOR LOW VOLTAGE APPLICATIONS

BACKGROUND OF THE INVENTION

1. Field of the Invention

The present invention relates to a pull-up/pull-down output stage suitable for low supply-voltage applications. More particularly, the present invention relates to an output stage for an electronic memory device and for low supply-voltage applications and of the type that includes a final stage of the pull-up/pull-down type made up of a complementary pair of transistors inserted between a primary reference supply voltage and a secondary reference voltage, and a voltage regulator for the control terminals of these transistors.

2. Discussion of the Related Art

As known, the function fulfilled by an output buffer stage of a memory device is to supply to the exterior of the device data taken during a reading operation of a memory cell.

Normally, a memory device presents at its output a load consisting of a large load capacitor Cload (usually 100 pF).

The load capacitor Cload is charged or discharged depending on whether the cell read is written or virgin.

A conventional method of performing this operation is described with reference to FIG. 1 in which reference number 1 indicates as a whole the output stage of a memory device. This stage 1 comprises a load capacitor Cload connected downstream of a final stage 2 of the pull-up/pull-down type.

Specifically the load capacitor Cload is charged by a pull-up transistor 3 and discharged by a pull-down transistor 4.

The final stage 2 is connected downstream of a control logic 5 and has an output terminal 6.

Since the output buffer 1 is one of the key elements of the reading path, its performance, in particular in terms of switching time, influences in a determinant manner the access time to the memory device.

This access time consists of three principal factors:
- decoding time (in a 30% proportion),
- reading time (in a 40% proportion), and
- switching time Tcomm of the output buffer 1 (in a 30% proportion).

At the present time, in the field of memory devices integrated on semiconductor, there is a tendency to provide devices operating with ever lower supply voltages Vcc so as to reduce the power dissipated by the device which is linked quadratically to the supply voltage Vcc. This however involves slowing propagation of the data being read.

Indeed, it is possible to determine a relationship of inverse dependence between the supply voltage Vcc and the switching time Tcomm of the output buffer 1, whose function can be essentially assimilated with that of the logical inverter.

The switching time Tcomm is defined, for questions of symmetry, as the time necessary to take the output 6 of the buffer 1 to a voltage of Vcc/2 starting from the instant the data read is stored in a latch register. Normally, the data is read through a sense amplifier and is stored in register or latch.

To determine in a simple manner the relationship between the switching time Tcomm and the supply voltage Vcc, the pull up and pull down transistors 3 and 4, which work in saturation zone for any supply voltage Vcc, can be considered, and the Early effect can be ignored. In this manner the transistors 3 and 4 can be considered as ideal current generators and the problem of calculating the switching time Tcomm is reduced to the charging and discharging of a constant current capacitor.

It is thus possible to find a relationship between switching time Tcomm of the device and supply voltage Vcc to solve a system consisting of the following equations:

$$i = C \cdot \frac{dV}{dt} \quad (1.1)$$

$$i = K \cdot \left(\frac{W}{L}\right) \cdot (Vgs - VT)^2 \quad (1.2)$$

where:
- i is the charge and discharge current of the load capacitor Cload,
- C is the value of the load capacitor Cload,
- V is the voltage at the ends of the load capacitor Cload,
- W/L is the form ratio of the pull-up 3 and pull-down 4 transistors,
- K is Boltzmann's constant,
- Vgs is the gate-source voltage of the pull-up 3 and pull-down 4 transistors, and
- VT is the threshold voltage of the pull-up 3 and pull-down 4 transistors.

Integrating the equation (1.1) from 0 to Vcc/2 and substituting therein the equation (1.2) the following relationship is found:

$$Tcomm = C \cdot \frac{Vcc}{2} \cdot \frac{1}{K \cdot \left(\frac{W}{L}\right) \cdot (Vcc - VT)^2} \quad (2)$$

which shows the inverse dependence between the switching time Tcomm and the supply voltage Vcc.

One of the solutions conventionally proposed to obtain a certain performance in terms of switching time Tcomm for an output buffer of a memory device with the change in supply voltage Vcc calls for changing the dimensions of the transistors used and specifically their form ratio (W/L). From the relationship (2) is found:

$$\left(\frac{W}{L}\right) = C \cdot \frac{Vcc}{2} \cdot \frac{1}{K \cdot (Vcc - VT)^2} \cdot \frac{1}{Tcomm} = \frac{Vcc}{(Vcc - VT)^2} \alpha \quad (3)$$

For a threshold voltage VT of 1V (in reality, this threshold voltage VT changes with the change in the technological process of the device manufacturer although not departing much from the unitary value in the known processes) there are found the following relationships:

| Vcc | (Vcc–VT)$^2$ | (W/L) | (W/L)$_{normalized}$ |
|---|---|---|---|
| 5 | 16 | 5/16 | 1 |
| 3 | 4 | 3/4 | 12/5 |
| 2 | 1 | 2 | 32/5 |

On the basis of the results set forth in the above table there is then selected the form ratio (W/L) of the transistors to be used. A correct choice must however consider transistors with the minimum possible channel length L (and appropriate width W) so that the transistors will be protected against electrostatic charges (constraints imposed on the basis of specific safety standards).

Although advantageous in some ways this solution implies that, at low supply voltages, the surface area occupied by the final stage 2 including the pull-up 3 and pull-down 4 transistors increases considerably.

The technical problem underlying the present invention is to conceive an output stage for memory devices and having structural and functional characteristics permitting optimization of the switching time of the stage with low supply voltages for equal surface area occupied to overcome the limitations which still afflict the output stages provided in accordance with the related art.

SUMMARY OF THE INVENTION

The solution idea underlying the present invention is to improve the switching time of the output stage comprising the final pull-up/pull-down stage to increase the current flowing in the final stage while boosting the gate voltage applied to the pull-up/pull-down transistors incorporated in the final stage.

An embodiment of the invention is directed to an output stage for an electronic memory device and for low supply-voltage applications. The output stage includes a final stage of a pull-up/pull-down type made up of a pair of complimentary transistors that are insertable between a primary reference supply voltage and a second reference supply voltage. Each of the pair of complimentary transistors has a control terminal. The output stage further includes a voltage regulator having a respective output for the control terminal of each of the pair of complimentary transistors. The voltage regulator is a voltage booster using at least one bootstrap capacitor to increase a current flowing in the final stage and raising an absolute value of a voltage applied to the control terminals.

The characteristics and advantages of the output stage in accordance with the present invention are set forth in the description of an embodiment thereof given below by way of non-limiting example with reference to the drawings.

DETAILED DESCRIPTION

Figure 1:
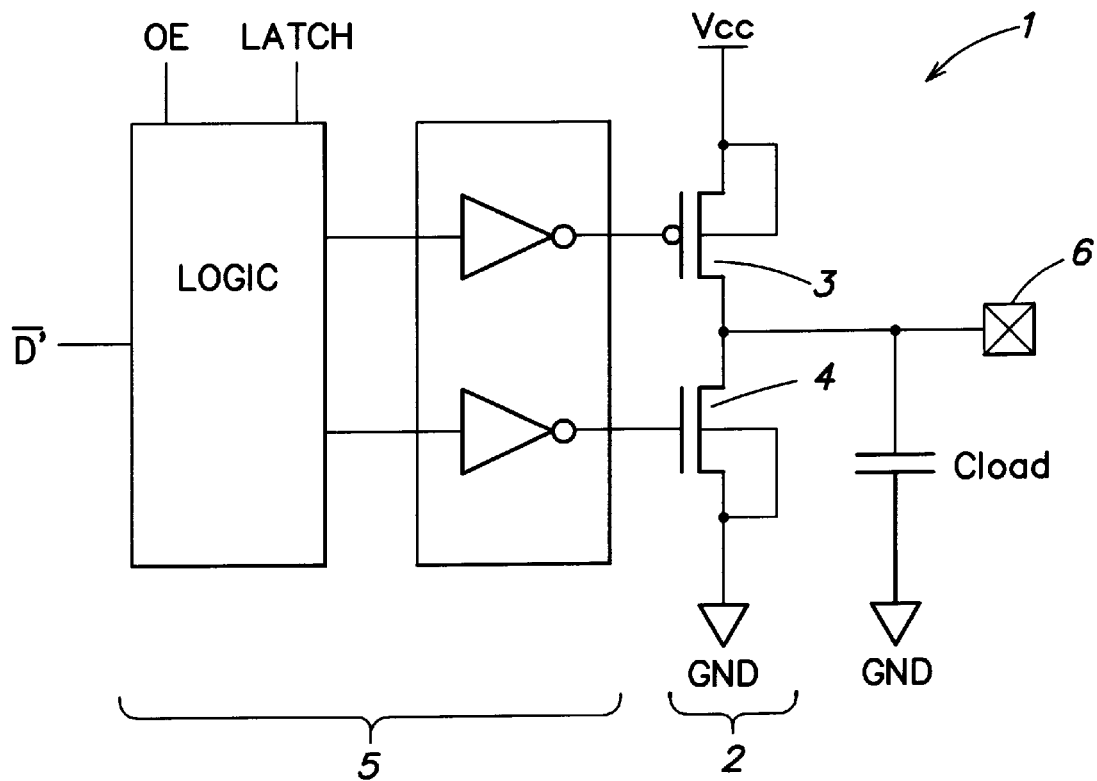
FIG. 1 shows schematically an output stage provided in accordance with the related art for an electronic memory device.
Figure 2:
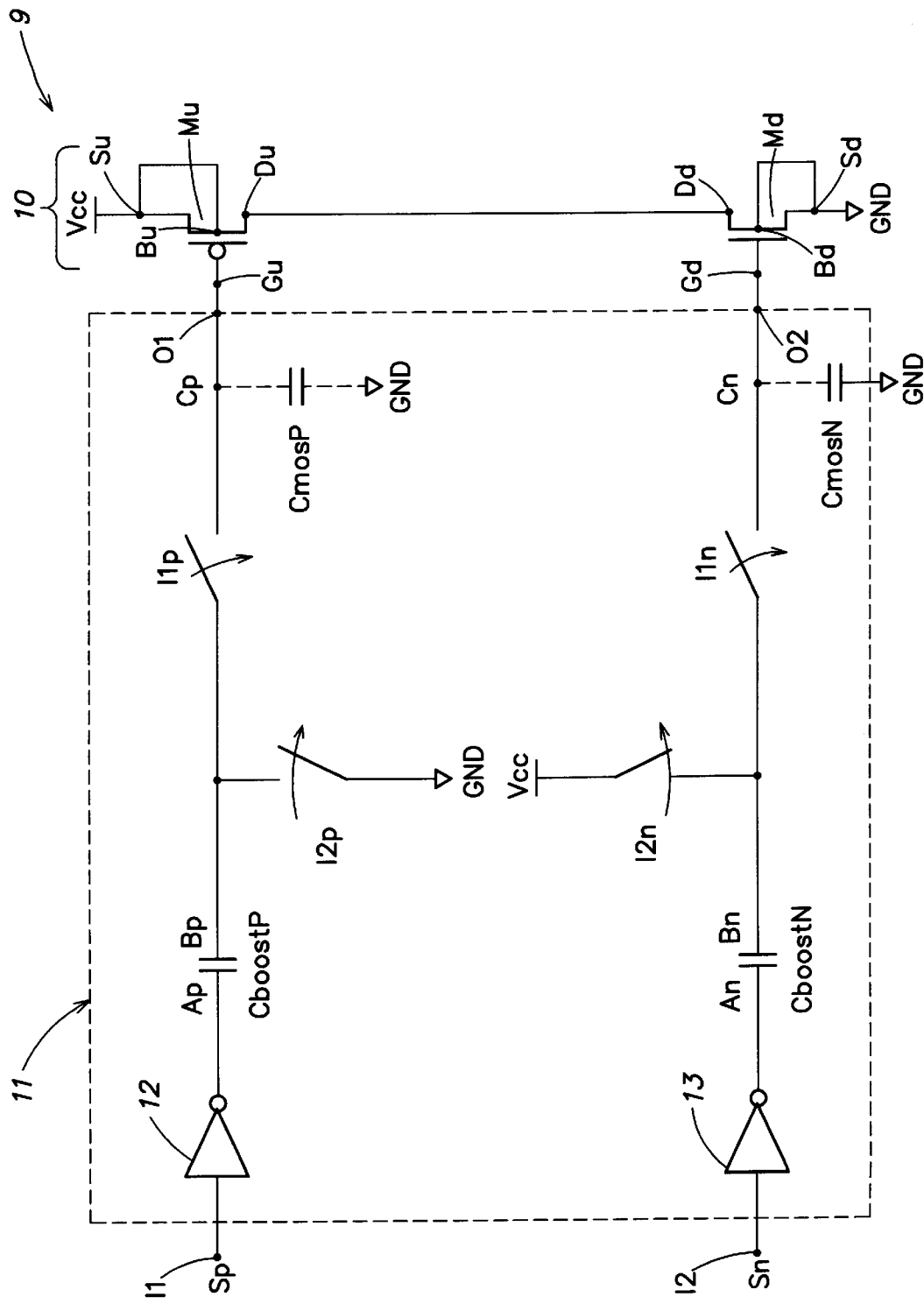
FIG. 2 shows an output stage provided in accordance with the present invention.

With specific reference to the example of FIG. 2, reference number 9 indicates as a whole an output stage for a memory device including a final stage 10 of the pull-up/pull-down type and a voltage regulator 11.

This final stage 10 of the pull-up/pull-down type includes a pull-up transistor Mu and a pull-down transistor Md inserted in mutual series between a primary reference supply voltage Vcc and a secondary reference supply voltage, i.e., a signal ground GND.

In particular, the pull-up transistor Mu is a P-channel MOS transistor having a source terminal Su connected to a body terminal Bu and to the primary reference supply voltage Vcc. The transistor Mu also has a drain terminal Du connected to a drain terminal Dd of the pull-down transistor Md and a gate terminal Gu connected to a first output terminal O1 of a voltage regulator 11.

The other pull-down transistor Md has a source terminal Sd connected to a body terminal Bd and to the secondary reference supply voltage, i.e., ground GND, as well as a gate terminal Gd connected to a second output terminal O2 of the voltage regulator 11.

Figure 3:
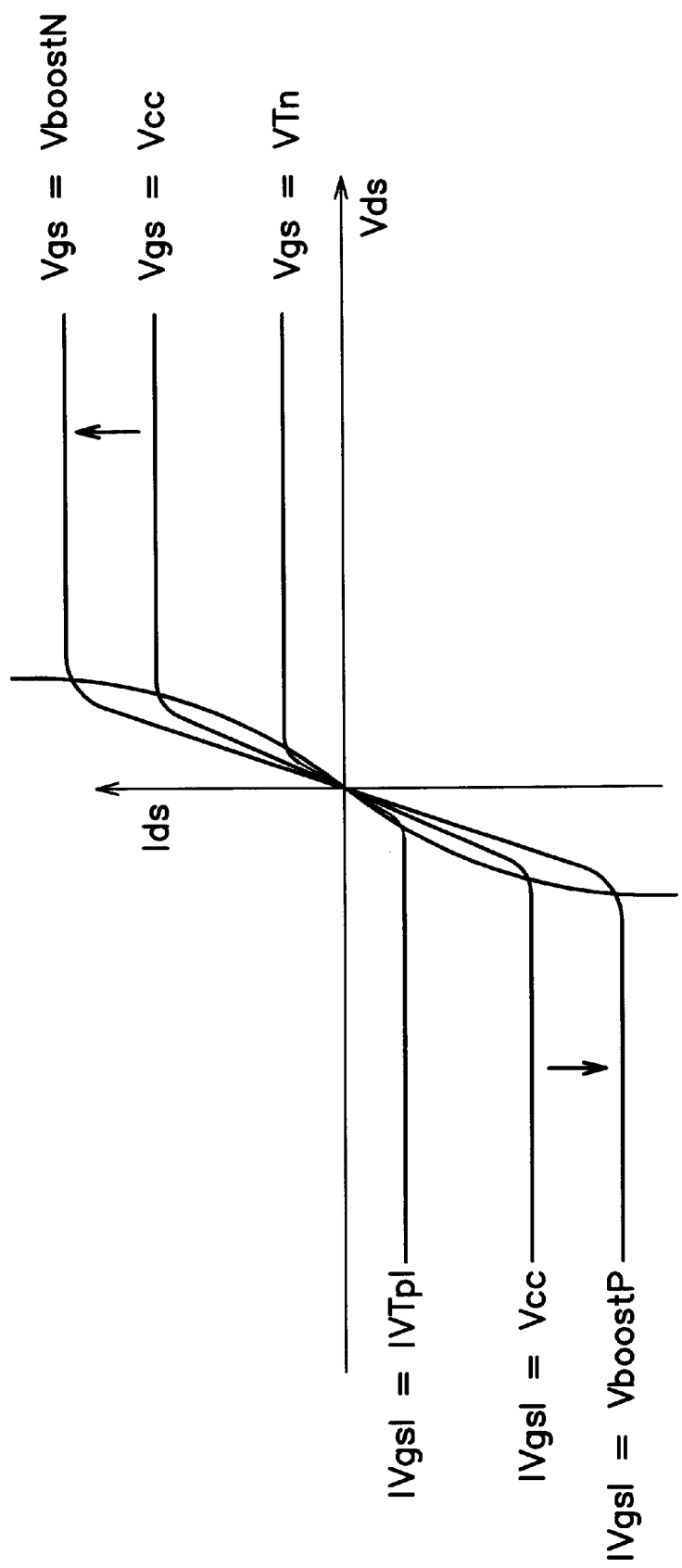
FIG. 3 shows characteristic voltage-current curves of a final stage of the pull-up/pull-down type incorporated in the output stage of FIG. 2.

As shown in FIG. 3, it is possible to change the value of the current Ids running through the pull-up transistor Mu and pull-down transistor Md to increase the gate-source voltage drop Vgs. Specifically the current Ids increases in module with the increase in the module of the gate voltage Vgs. It is recalled that for P-channel transistors the current flows between source and drain and thus the current Ids has negative sign.

In addition it is noted that the pull-up transistor Mu and pull-down transistor Md are started by connecting them respectively to the supply voltage Vcc and to ground GND. In this manner and in both cases the voltage Vgs for operation of the final stage 10 of the pull-up/pull-down type is equal to Vcc.

The diagrams of FIG. 3 show how it is possible to significantly increase the current Ids by means of a gate voltage Vgs=Vboost higher than the supply voltage Vcc. To accomplish this it is necessary to take the gate terminal Gu of the pull-up transistor Mu to a voltage higher than the supply voltage Vcc and the gate terminal Gd of the pull-down transistor Md to a voltage lower than ground GND.

The operation by which it is possible to boost, i.e., obtain voltages higher than the supply voltage or lower than ground, is termed "bootstrap."

It is possible to carry out this bootstrap operation by means of the regulator 11 shown in FIG. 2.

The regulator 11 includes a first circuit branch and a second circuit branch, i.e., one for each transistor of the final stage 10. The first circuit branch has a first input terminal I1 of the regulator while the second circuit branch has a second input terminal I2.

The inputs I1 and I2 receive respectively a first regulation signal Sp and a second regulation Sn. Furthermore, the inputs I1 and I2 are connected respectively to the first output terminal O1 and the second output terminal O2 by means of respective delay elements 12, 13, respective bootstrap capacitors CboostP, CboostN, and respective first switches I1p, I1n.

The bootstrap capacitors CboostP, CboostN have respective first terminals Ap, An connected to the delay elements 12 and 13 and respective second terminals Bp, Bn connected to ground GND and to the reference voltage Vcc by means of respective second switches I2p, I2n. The second terminals Bp and Bn are connected respectively to the first output terminal O1 and the second output terminal O2 by means of the first switches I1p, I1n.

The output terminals O1 and O2 are connected to ground GND by means of respective parasite capacitors of pull-up and pull-down transistors CmosP, CmosN.

In a preferred embodiment these second switches I2p, I2n include MOS transistors respectively of the N-channel and P-channel types appropriately driven.

The bootstrap operation can be divided essentially in two phases, as follows:
1. charging of the bootstrap capacitor Cboost, and
2. boosting of the voltage of a terminal of the bootstrap capacitor Cboost.

During the first phase, the bootstrap capacitor CboostN for the pull-down transistor Md is charged at the moment of closing of the second switch I2n and thus upon connection with the reference supply voltage Vcc.

In particular, in the presence of a high regulation signal Sn, the first terminal An of the bootstrap capacitor CboostN is at the ground voltage GND value, while the second terminal Bn is at the supply voltage Vcc.

To optimize the efficiency of this operation, the switch I2n designed for charging of the bootstrap capacitor (and in particular the MOS transistor contained therein), is appropriately sized to ensure that the second terminal Bn of the bootstrap capacitor CboostN reaches the supply voltage Vcc.

The critical parameter of this operation is the 'on' time, which can be divided in two contributions:

'inactive phase', which coincides with the time elapsed since beginning of the memory cell reading operation (generation of a storage signal ATD) and when a data to be read (contained in a memory cell) is stored. In accordance with conventional techniques the data is read through a sense amplifier and stored in a register (or latch). In this time lapse the output stage 9 must hold the logical value of previously read data at output.

'active phase', which begins with the rising slope of a signal LATCH for activation of the register (or latch) and coincides with the time necessary for the output stage 9 to bring back to output the logical stage of the cell read, i.e., the logical value of the data read.

In reality the interval considered useful is not the interval scanned by the generation of the storage signals ATD and activation signals LATCH but a shorter interval in such a manner as to ensure with a certain margin of safety reaching of the supply voltage Vcc by the second terminal Bn of the bootstrap capacitor CboostN.

When the sense amplifier has terminated its job, the activation signal LATCH which activates the storage of the data read is sent to a flip-flop preferably of type D and active on the rising slope.

When it is necessary to transfer a low logical level at output there is opened the second switch I2n to inhibit current leak to the reference supply voltage Vcc because of the charge present on the bootstrap capacitor CboostN, which would reduce the efficiency of the bootstrap operation. At the same time the first switch I1n is closed to simultaneously take the regulation signal Sn to a low logical value.

In this manner the first terminal An of the bootstrap capacitor CboostN shifts to a voltage equal to the supply voltage Vcc while the second terminal Bn of the bootstrap capacitor CboostN and the second output terminal O2 of the regulator 11 (made equipotential by closing of the first switch I1n) move to the same first overvoltage VboostN.

This first overvoltage VboostN is a function of the capacitive relationship between the bootstrap capacitor CboostN and the parasite capacitors connected to the internal circuit nodes of the regulator 11.

The first overvoltage VboostN is taken by imposing the charge conservation principle in the initial instant (t=0) and at rated operation, i.e., when Qi=Qf where Qi and Qf are respectively the initial charge and rated charge present on the bootstrap capacitor CboostN.

On the supposition that the pull-down transistor Md is initially off, i.e., when there are no initial charges on the armature of the load capacitor CmosN, the following relationships are found:

$$Qi = CbootN \cdot Vcc \quad (4.1)$$

$$Qf = CboostN \cdot (VboostN - Vcc) + CmosN \cdot VboostN \quad (4.2)$$

$$VboostN = \frac{CboostN}{CboostN + CmosN} \cdot 2 \cdot Vcc = 2 \cdot Vcc \cdot \frac{1}{1 + \frac{CmosN}{CboostN}} \quad (4.3)$$

The relationship (4.3) shows that the voltage found at the output O2 of the regulator 11 is inversely proportionate to the relationship CmosN/CboostN. When this relationship tends towards zero there is found the maximum value of the first overvoltage value VboostN which is equal to:

$$\lim_{\frac{CboostN}{CmosN} \to \infty} 2 \cdot Vcc \cdot \frac{1}{1 + \frac{CmosN}{CboostN}} = 2 \cdot Vcc \quad (5)$$

In like manner the bootstrap capacitor CboostP for the pull-up transistor Mu is discharged upon closing and thus upon connection with ground GND of the second switch I2p.

In particular, in the presence of a low regulation signal Sp, the first terminal Ap is at the value of the supply voltage Vcc, while the second terminal Bn is at the value of ground GND.

Upon arrival of the activation signal LATCH, if the data read corresponds to a high logical level, the second switch $I2_p$ is opened and the first switch I1p is closed to simultaneously take the regulation signal Sp to a high logical value.

In this manner the first terminal Ap of the bootstrap capacitor CboostN shifts to a value equal to ground GND, while the second terminal Bp of the bootstrap capacitor CboostP and the first output terminal O1 of the regulator 11, which are made equipotential by the closing of the first switch I1p, move to the same second value of negative voltage VboostP, i.e. less than ground.

By imposing, again in this case, the principle of charge conservation, the following relationship is found:

$$VboostP = Vcc \cdot \left( \frac{2}{1 - \frac{CmosP}{CboostP}} \right) \quad (6)$$

For the pull-up transistor Mu the maximum gate voltage obtainable at the output O1 of the regulator 11 is thus equal to:

$$\lim_{\frac{CboostN}{CmosN} \to \infty} Vcc \cdot \left(1 - \frac{2}{1 + \frac{CmosP}{CboostP}}\right) = -Vcc \quad (5)$$

Figure 4:
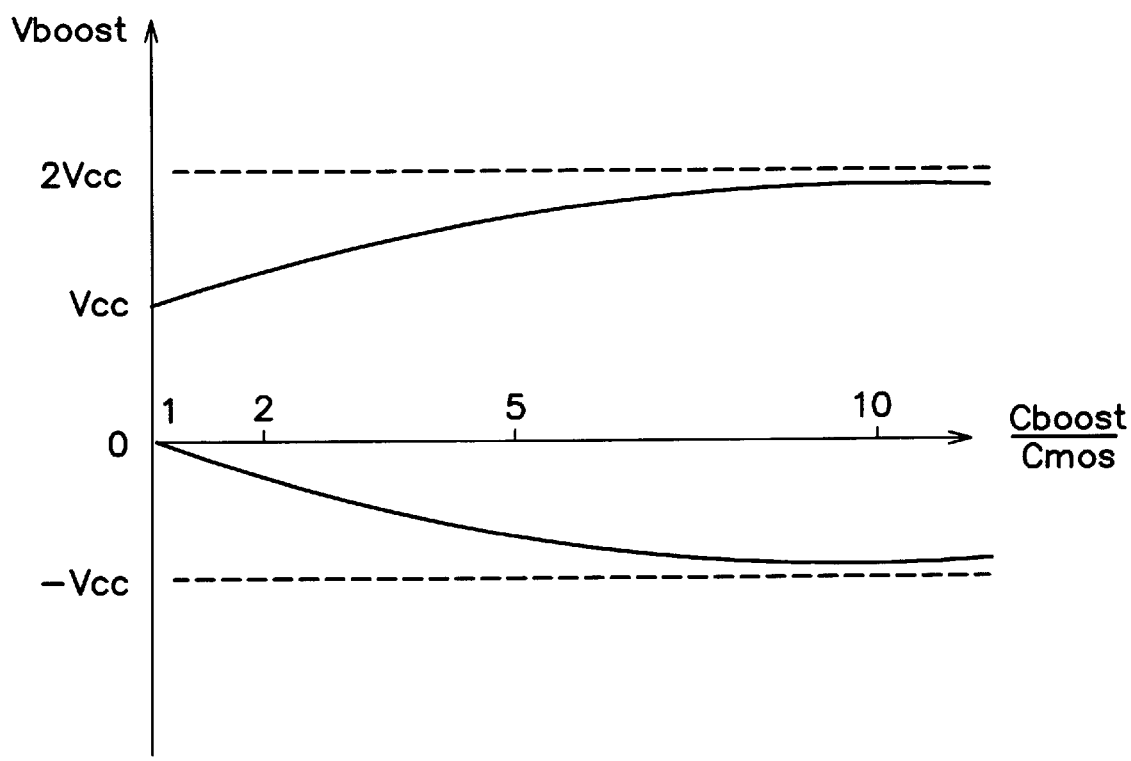
FIG. 4 shows possible behaviours of an output voltage of the regulator of FIG. 2.

In FIG. 4 are shown the qualitative behaviour of the overvoltages VboostN and VboostP output by the regulator 11 as a function of the ratio Cboost/Cmos, according to the simplifying suppositions, introduced for convenience in representation, of CboostN=CboostP=Cboost and CmosN=CmosP=Cmos. Thus the maximum gate voltage on the basis of which the final stage 2 of pull-up/pull-down can be driven is equal to 2Vcc, as shown in FIG. 4.

The regulator 11 of the pull-up transistor Mu and the pull-down transistor Md thus displays the following work intervals:

|  | Work Interval | Vmin | Vmax |
|---|---|---|---|
| pull up | VboostP→Vcc | ON | OFF |
| pull down | 0→VboostN | OFF | ON |

The value of the bootstrap capacitor must be a compromise between performances in terms of switching time of the output stage 9 and surface area occupied by this stage in such a manner as to achieve lower switching time for equal surface area.

The number of bootstrap capacitors present in the regulator 11 influences in a determinant manner the ratio switching time:surface area.

Figure 5:
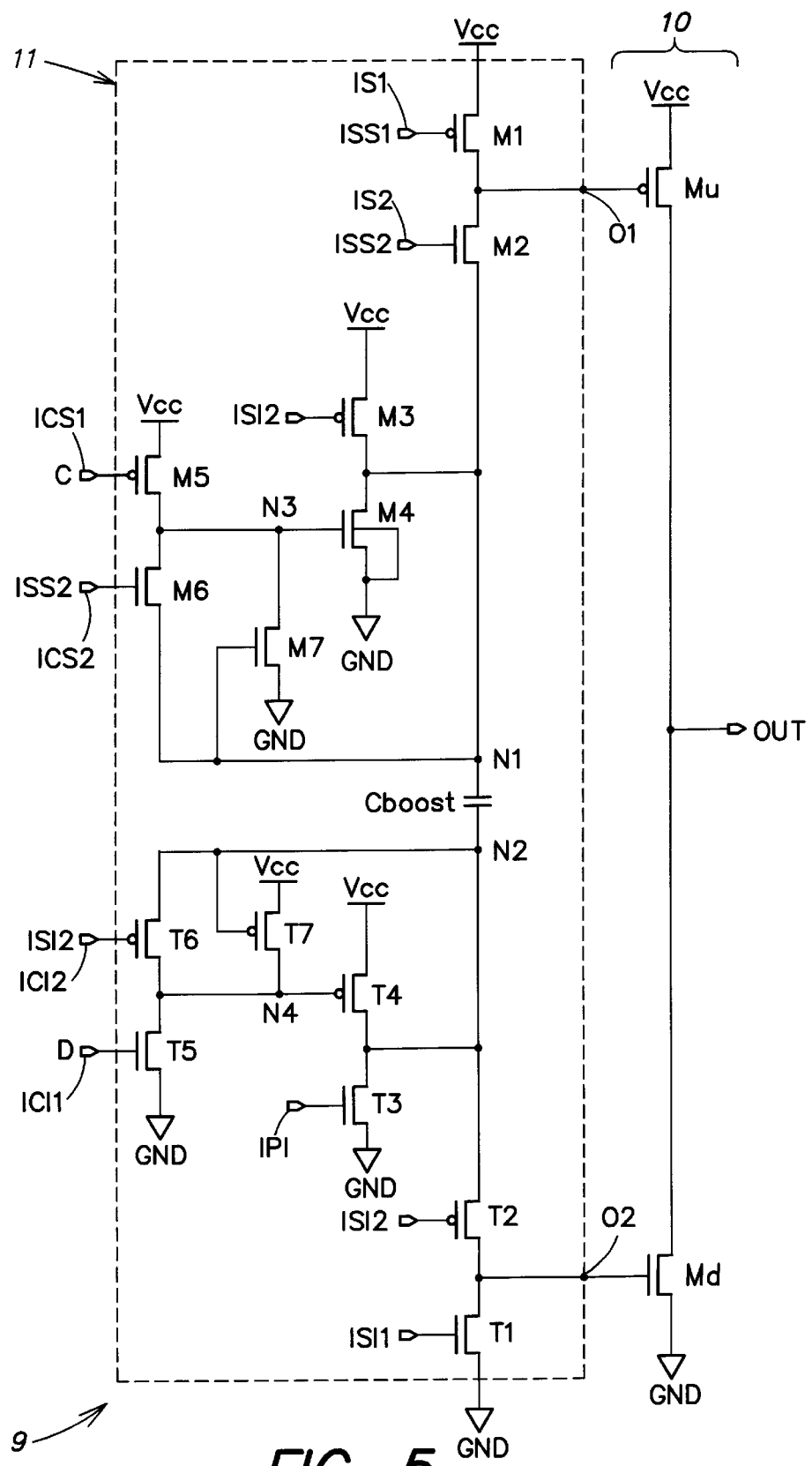
FIG. 5 shows an output stage including a voltage regulator with individual bootstrap capacitor for the final pull-up/pull-down stage in accordance with the present invention.

FIG. 5 shows a preferred embodiment of the output stage 9 in accordance with the present invention and including a regulator 11 with a single bootstrap capacitor Cboost and thus optimal performance in terms of the ratio switching time:surface area.

With reference to FIG. 5, reference number 9 indicates as a whole the output stage in accordance with the present invention including a voltage regulator 11 for a final stage 10 of the pull-up/pull-down type.

The regulator 11 is inserted between the reference supply voltage Vcc and ground GND and includes a single bootstrap capacitor Cboost.

This single capacitor has a first terminal N1 connected to the reference supply voltage Vcc through the series of a first upper selection transistor M1 and a second upper selection transistor M2. A second terminal N2 of the capacitor Cboost is connected to ground GND through the series of a first lower selection transistor T1 and a second lower selection transistor T2.

The upper selection transistors M1, M2 are preferably P-channel and N-channel MOS transistors respectively. In like manner the lower selection transistors T1, T2 are preferably N-channel and P-channel MOS transistor respectively.

The upper selection transistors M1, M2 have their drain terminals in common to form a first output terminal O1 of the regulator 11 and respective gate terminals connected to a first upper selection input IS1 and to a second upper selection input IS2 which receive respectively a first ISS1 and a second ISS2 upper selection signals.

In like manner the lower selection transistors T1, T2 have their drain terminals in common to form the second output terminal O2 of the regulator 11 and respective gate terminals connected to a first lower selection input and a second lower selection input which receive respectively a first lower selection signal ISI1 and a second lower selection signal ISI2.

The first terminal N1 of the bootstrap capacitor Cboost is also connected to the common drain terminals of a first upper drive transistor M3 and a second upper drive transistor M4 which are inserted in mutual series between the reference supply voltage Vcc and ground GND.

The first upper drive transistor M3 has its gate terminal connected to an upper drive input terminal which receives the second lower selection signal ISI2.

The second upper drive transistor M4 has its gate terminal connected to a first internal circuit node N3 which is in turn connected to ground GND through an upper switching transistor M7 having its gate terminal connected to the first terminal N1 of the bootstrap capacitor Cboost.

Preferably the first upper drive transistor M3 and the is an P-channel MOS transistor, while the upper switching transistor M7 and the second upper drive transistor M4 are N-channel MOS transistors.

The first terminal N1 of the bootstrap capacitor Cboost is further connected to the reference supply voltage Vcc through the series of a first upper control transistor M5 and a second upper control transistor M6 having drain terminals in common and connected to the first internal circuit node N3 and gate terminals connected to a first upper control terminal ICS1 and a second upper control terminal ICS2 receiving respectively an upper control signal C and the second upper selection signal ISS2.

Preferably the first MS and second M6 upper control transistors are P-channel and N-channel MOS transistors respectively.

In like manner the second terminal N2 of the bootstrap capacitor Cboost is connected to the common drain terminals of a first lower drive transistor T3 and a second lower drive transistor T4 which are inserted in mutual series between the reference supply voltage Vcc and ground GND.

The first lower drive transistor T3 has its gate terminal connected to a lower drive input terminal IPI which receives the second upper selection signal ISS2.

The second lower drive transistor T4 has its gate terminal connected to a second internal circuit node N4 which is in turn connected to the reference supply voltage Vcc through a lower switching transistor T7 having its gate terminal connected to the second terminal N2 of the bootstrap capacitor Cboost.

Preferably the second lower drive transistor T4 and the lower switching transistor T7 are P-channel MOS transistors while the first lower drive transistor T3 is an N-channel MOS transistor. The second terminal N2 of the bootstrap capacitor Cboost is also connected to ground GND through the series of a first lower control transistor T5 and a second lower control transistor T6 having drain terminals in common and connected to the second internal circuit node N4 and gate terminals connected to a first lower control terminal ICI1 and a second lower control terminal ICI2 which receive respectively a lower control signal D and the second lower selection signal IS2.

Preferably the first T5 and second T6 upper control terminals are N-channel and P-channel MOS transistors respectively.

There is now described operation of the output stage 9 in accordance with the present invention.

For the sake of simplicity we shall assume the pull-up transistor Mu and pull-down transistor Md are initially off. This condition implies that the primary upper selection transistor M1 and the primary lower selection transistor T1 are open, and the secondary upper selection transistor M2 and the secondary lower selection transistor T2 are off.

The precharge phase of the bootstrap capacitor Cboost, termed 'inactive phase' above, begins with arrival of the storage signal ATD.

The upper control signal C moves to a low logical level while the first internal circuit node N3 moves to a high logical level. There is thus turned on the second upper drive transistor M4 which takes the first terminal of the bootstrap capacitor Cboost to ground voltage GND value In like manner the lower control signal D moves to a high logical level while the second internal circuit node N4 moves to a low logical level. There is thus turned on the second upper drive transistor T4 which takes the second terminal N2 of the bootstrap capacitor Cboost to the value of the supply voltage Vcc.

The 'inactive phase' ends upon arrival of the activation signal LATCH.

The upper control signal C then moves to a high logical level and thus turns off the first upper control transistor M5.

In like manner the lower control signal D moves to a low logical level and thus turns off the first lower control transistor T5.

At this point is started the active phase defined above and including turning on of the pull-up/pull-down transistors through voltages higher than the supply voltage Vcc or lower than ground voltage GND.

In particular, turning on of the pull-up transistor Mu is commanded by the upper selection signals ISS1 and ISS2. The first upper selection signal ISS1 moves to a high logical value and turns off the first upper selection transistor M1. In like manner the second upper selection signal ISS2 moves to a high logical value and opens the second upper selection transistor M2 and the second upper control transistor M6 and turns on the first lower drive transistor T3.

In this manner the second terminal N2 of the bootstrap capacitor Cboost moves to a ground voltage GND value while the first terminal N1 of the bootstrap capacitor Cboost and the first internal circuit node N3 move to a second negative voltage value VboostP to permit the second upper driver transistor M4 to remain turned off and the pull-up transistor Mu to turn on.

In dual manner turning on of the pull-down transistor Md is controlled by the lower selection signals ISI1 and ISI2.

The first lower selection signal ISI1 moves to a low logical value to turn off the first lower selection transistor T1. In like manner the second lower selection signal ISI2 moves to a low logical value to open the second lower selection transistor T2 and the second lower control terminal T6 and turn on the first upper driver transistor M3.

In this manner the first terminal N1 of the bootstrap capacitor Cboost moves to a supply voltage Vcc value while the second terminal N2 of the bootstrap capacitor Cboost and the second internal circuit node N4 move to a first value of overvoltage VboostN to permit the second lower drive transistor T4 to remain off and the pull-down transistor Md to turn on.

Advantageously in accordance with the present invention the upper selection signals ISS1, ISS2 and lower selection signals ISI1, ISI2 are in sequence. The delay between these signals can be provided in a manner known to those skilled in the art by using a pair of cascaded appropriately sized inverters.

This delay must be such as to ensure closing to the reference supply voltage Vcc carried out by the first upper selection transistors M1 and to ground GND carried out by the first lower selection transistor T1 so as to avoid charge losses during bootstrap operation of the capacitor Cboost.

From the above explanation of operation of the output stage 9 in accordance with the present invention it is clear that the terminals N1 and N2 of the bootstrap capacitor Cboost of the regulator 11 take on values outside the normal range of operation of the MOS transistor devices, i.e. between 0 and Vcc. It is thus necessary to make sure that, for values outside this normal operation range, none of the junctions of the MOS transistors leading to the terminals N1 and N2 is directly biased.

In particular the substrate of the N-channel MOS transistor must be connected to the minimum potential value and that of the P-channel MOS transistors to the maximum potential value.

In circuits provided in accordance with the prior art, the bulk terminals of the P-channel MOS transistors are normally connected to the reference supply voltage Vcc while the bulk terminals of the N-channel MOS transistor (bulkN) are normally connected to the reference voltage ground GND. This configuration does not ensure correct operation of the P-channel and N-channel MOS transistors outside the normal operating range and, in particular, during the bootstrap phase.

The output stages provided in accordance with known configurations of MOS transistors can thus use the bootstrap operation in accordance with the present invention in a limited manner. Correct operation of the output stage is ensured only if the first terminal N1 of the bootstrap capacitor Cboost does no fall below the value −Vg lower than the threshold voltage of the drain-bulk junction while the second terminal N2 of the bootstrap capacitor Cboost does not rise above the value Vcc+|Vg|.

Unfortunately it is not simple to accurately limit the bootstrapped voltage value, which is a function of the variations of the transistor dimensions which are linked to the technology used, the parasite capacitive couplings, etc.

In addition, the overvoltage obtained through the bootstrap operation would be limited to a value lower than the threshold voltage of a MOS transistor. Indeed, to ensure correct limitation of the bootstrapped voltage for any supply voltage coinciding with the minimum voltage value the output voltage boost would be limited to a few hundreds of millivolts (approximately 0.5 V).

It is possible to overcome these shortcomings by providing a voltage switch in such a manner as to drive appropriately the bulk terminals of the MOS transistors used.

Figure 6:
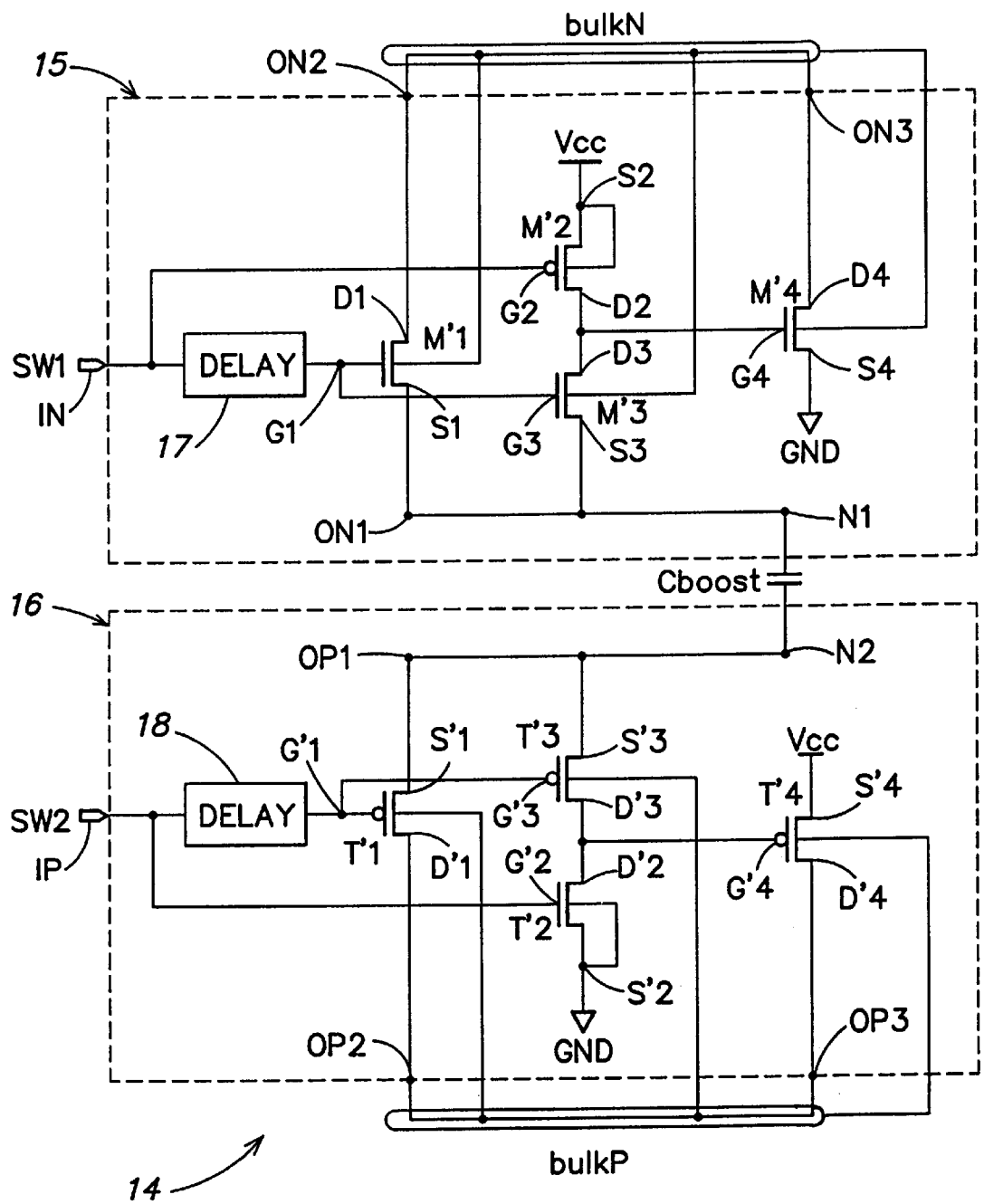
FIG. 6 shows a switch designed to be coupled with the regulator of FIG. 5.

In particular, FIG. 6 shows a switch 14 designed to hold the bulk terminals of the P-channel MOS transistors (bulkP) at a voltage equal to the supply voltage Vcc when the voltage of the second terminal N2 of the bootstrap capacitor Cboost is lower than or equal to the supply voltage Vcc by connecting them to the second terminal N2 of the bootstrap capacitor Cboost only during the bootstrap phase of the pull-down transistor Md.

In like manner the switch 14 is designed to hold the bulk terminals of the N-channel MOS transistors (bulkN) at a ground voltage GND value when the voltage of the first terminal N1 of the bootstrap capacitor Cboost is higher than or equal to 0V by connecting them to the first terminal N1 of the bootstrap capacitor Cboost only during the bootstrap phase of the pull-up transistor Mu.

The switch 14 includes a first control portion 15 and a second control portion 16 inserted between the reference supply voltage Vcc and ground GND and having first output terminals ON1, OP1 connected respectively to the first terminal N1 and second terminal N2 respectively of the bootstrap capacitor Cboost.

The first control portion 15 includes a delay element 17 inserted between an input terminal IN and the gate terminal G1 of a first switching transistor M'1 and having its source terminal S1 connected to the first terminal N1 of the bootstrap capacitor Cboost and its drain terminal D1 connected to a second output terminal ON2 of the first control portion 15.

The input terminal IN receives a first switch signal SW1 and is further connected to the gate terminal G2 of a second switching transistor M'2 having its source terminal S2 connected to its bulk terminal and to the reference supply voltage Vcc and its drain terminal D2 connected to the drain terminal D3 of a third switching transistor M'3.

The third switching transistor M'3 has its gate terminal G3 connected to the gate terminal G1 of the first switching transistor M'1 and its source terminal S3 connected to the first terminal N1 of the bootstrap capacitor Cboost.

The common drain terminals D2 and D3 of the switching transistors M'2 and M'3 are connected to the gate terminal G4 of another switching transistor M'4 having its source terminal S4 connected to the reference ground voltage GND and its drain terminal D4 connected to a third output terminal ON3 of the first control portion 15.

The second output terminal ON2 and third output terminal ON3 of the first control portion 15 are connected to the bulk terminals of the N-channel MOS transistor (bulkN) present in the output stage 9 connected to the node N1.

In particular, the first M'1, third M'3 and fourth M'4 switching transistors are N-channel MOS transistors with bulk terminals provided by means of triple-well technology in such a manner as to not be necessarily constrained to a ground voltage value (common connection of all the N-channel MOS transistor substrates). It is necessary to use the triple-well technology for all the N-channel MOS transistors connected to the first terminal N1 of the bootstrap capacitor Cboost.

The second switching transistor M'2 is a P-channel MOS transistor and does not display problems concerning its bulk terminal which uses an appropriately 'ringed' n-well tank and is thus insulated from the bulk terminals of the other P-channel MOS transistors.

In like manner the second control portion 16 includes a delay element 18 inserted between an input terminal IP and the gate terminal G'1 of a first switching transistor T'1 and having its source terminal S'1 connected to the second terminal N2 of the bootstrap capacitor Cboost and drain terminal D'1 connected to a second output terminal OP2 of the second control portion 16.

The input terminal IP receives a second switching signal SW2 and is connected additionally to the gate terminal G'2 of a second switching transistor T'2 having its source terminal S'2 connected to its bulk terminal and to the reference voltage ground GND and drain terminal D'2 connected to the drain terminal D'3 of a third switching transistor T'3.

The third switching transistor T'3 has its gate terminal G'3 connected to the gate terminal G'1 of the first switching transistor T'1 and its source terminal S'3 connected to the second terminal N2 of the bootstrap capacitor Cboost.

The common drain terminals D'2 and D'3 of the switching terminals T'2 and T'3 are connected to the gate terminal G'4 of another switching transistor T'4 having its source terminal S'4 connected to the reference supply voltage Vcc and its drain terminal D'4 connected to a third output terminal OP3 of the second control portion 16.

The second OP2 and third OP3 output terminals of the second control portion 16 are connected to the bulk terminals of the P-channel MOS transistors (bulkP) present in the output stage 9 connected to the node N2.

In particular the first T'1, third T'3 and fourth T'4 switching transistors are P-channel MOS transistors with bulk terminals provided by means of n-wells while the second switching transistor T'2 is an N-channel MOS transistor. For the latter it is not necessary to employ triple-well technology since it is not connected to the first terminal N1 of the bootstrap capacitor Cboost.

Operation of the switching circuit 14 in accordance with the present invention is now discussed.

The voltage present on the first N1 and second N2 terminals of the bootstrap capacitor Cboost varies between VboostP and Vcc and between 0 and VboostN respectively. In particular:

| Operational phase | Voltage on the first terminal N1 | Voltage on the secon terminal N2 |
|---|---|---|
| Precharge on the bootstrap capacitor Cboost | 0 | Vcc |
| Boost of the pull-up transistor Mu | VboostP | 0 |
| Boost of the pull-down transistor Md | Vcc | VboostN |

Switching signals SW1 and SW2 must be timed in such a manner that the bulk terminals of the P-channel transistors do not fall below the voltage present on the second terminal N2 of the bootstrap capacitor Cboost while the voltage present on the bulk terminals of the N-channel transistors do not exceed that present on the first terminal N1 of the bootstrap capacitor Cboost.

Thus, during the precharging phase of the bootstrap capacitor Cboost, when the first terminal N1 of the bootstrap capacitor Cboost is at a ground voltage value and the second terminal N2 is at a supply voltage Vcc value, the first switch signal SWI is at a low logical value. In this manner the first M'1 and third M'3 switching transistors of the first control portion 15 are off while the second M'2 and fourth M'4 switching terminals are on.

The bulk terminals of the N-channel transistors (bulkN) are thus held at a ground potential value equal to that present on the first terminal N1 of the bootstrap capacitor Cboost.

In like manner, the second switch signal SW2 is at a high logical value. In this manner the first T'1 and second T'3 switching transistors of the second control portion 16 are off while the third T'2 and fourth T'4 switching transistors are on.

The bulk terminals of the P-channel transistors (bulkp) are thus held at a potential supply voltage value equal to that present on the second terminal N2 of the bootstrap capacitor Cboost.

During the boost phase of the pull-up transistor Mu the first terminal N1 of the bootstrap capacitor Cboost is at the supply voltage Vcc value while the second terminal N2 is at the first overvoltage value VboostN.

The second switch signal SW2 is taken to a low logical value. In this manner the second switching transistor T'2 is turned off and, with a delay DEL imposed by the delay element 18 of the second control portion 16, the first T'1 and third T'3 switching transistors of the second control portion 16 are turned on.

The bulk terminals of the P-channel transistors are thus taken to the first overvoltage value VboostN due to the turning on of the first switching transistor T'1.

The third switching transistor T'3 impedes the current path to the reference supply voltage Vcc to bias the gate terminal G'4 of the fourth switching transistor T'4 at a potential value equal to that present on its drain terminal D'4.

The delay DEL imposed by the delay element 18 must be such as to ensure complete turning off of the second switching transistor T'2 to inhibit migration of charges to the reference terminal of ground GND.

In like manner, during the boost phase of the pull-down transistor Md the first terminal N1 of the bootstrap capacitor Cboost is at the second negative voltage value VboostP, while the second terminal N2 is at the ground voltage value.

The first switch signal SWI is taken to a high logical value. In this manner the second switching transistor M'2 is turned off and, with a delay DEL' imposed by the delay element 17 of the first switching portion 15, the first M'1 and third M'3 switching transistors of the first control portion 15 are turned on.

The bulk terminals of the N-channel transistors (bulkN) are thus taken to the second overvoltage value VboostP. In addition, direct biasing of the junction between drain terminals and bulk terminals provided by means of the triple-well technology is inhibited.

Advantageously the fourth upper and lower switching transistors M'4 and T'4 are turned off during the bootstrap phase, returning to their gate terminals the voltage value present on the drain terminals.

In this manner:
   undesired charge losses of the bootstrap capacitor Cboost are avoided, and
   the value achievable by the output overvoltages is not limited in advance.

Indeed, if on the gate terminal of the lower switching transistor T'4 were merely imposed a voltage equal to the supply voltage Vcc, when the voltage present on the drain terminal of the transistor T'4 reached a value equal to Vcc+|Vthp| (Vthp being a threshold voltage of a P-channel MOS transistor), the transistor T'4, being diode-configured, would turn on.

The turning on of the switching transistor T'1 blocks the first overvoltage value VboostN of the second output terminal O2 of the regulator 11 at the value Vcc+|Vg|.

Like observations apply to the switching transistor M'1. Indeed, if on the upper switching transistor M'1 were merely imposed a voltage value equal to ground GND the second overvoltage value VboostP of the first output terminal O1 of the regulator 11 could not fall below a value 0-Vtn since Vtn is a threshold voltage of an N-channel MOS transistor, which is positive by definition.

In both cases therefore there would be an increase in the output voltage of the regulator 11 equal only to the threshold voltage of the N-channel and P-channel MOS transistors.

It should be understood that the output stage 9 integrated by the switching circuit 14 in accordance with the present invention permits obtaining higher bootstrap voltages compared to the known solutions and ensures safety of the junctions of the transistors used.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. An output sage for an electronic memory device and for low supply-voltage applications, the output stage, comprising:
   a final stage of a pull-up/pull-down type made up of a pair of complementary transistors that are insertable between a primary reference supply voltage and a secondary reference voltage, each of the pair of complementary transistors having a control terminal; and
   a voltage regulator having a respective output for the control terminal of each of the pair of complementary transistors, wherein the voltage regulator is a voltage booster using at least one bootstrap capacitor to increase a current flowing the final stage and raising an absolute value of a voltage applied to the control terminals;
   wherein the pair of complementary transistors includes a first transistor and a second transistor, and wherein the voltage regulator includes:
   a first circuit branch for the first transistor, the first circuit branch having:
      a first input terminal that receives a first regulation signal,
      a first delay element,
      a first bootstrap capacitor, and
      a first switch, wherein the first input terminal is coupled to the control terminal the first transistor through the first delay element, the first bootstrap capacitor and the first switch; and
   a second circuit branch for the second transistor, the second circuit branch having:
      a second input terminal that receives a second regulation signal,
      a second delay element,
      a second bootstrap capaitor, and
   a second switch, wherein the second input terminal is coupled to the control terminal of the second transistor through the second delay element, the second bootstrap capacitor and the second switch;
   wherein the first circuit branch further includes a third switch; wherein the first bootstrap capacitor includes a first terminal connected to the first delay element, and a second terminal that couples to the secondary reference voltage through the third switch; wherein the second terminal of the first bootstrap capacitor is further coupled to the control terminal of the first transistor through the first switch; wherein the second circuit branch further includes a fourth switch; wherein the second bootstrap capacitor includes a first terminal connected to the second delay element, and a second terminal that couples to the reference supply voltage through the fourth switch; and wherein the second terminal of the second bootstrap capacitor is further coupled to the control terminal of the second transistor through the second switch.

2. An output stage for an electronic memory device and for low supply-voltage applications, the output stage comprising:
   a final stage of a pull-up/pull-down type made up of a pair of complementary transistors that are insertable between a primary reference supply voltage and a secondary reference voltage, each of the pair of complementary transistors having a control terminal; and
   a voltage regulator having a respective output for the control terminal of each of the pair of complementary transistors, wherein the voltage regulator is a voltage booster using at least one bootstrap capacitor to increase a current flowing in the final stage and raising an absolute value of a voltage applied to the control terminals;
   wherein the voltage regulator includes:
   a first upper pair of selection transistors in series, a connection node formed between the first upper pair of selection transistors coinciding with an output of the voltage regulator;
   a second lower pair of selection transistors in series, a connection node formed between the second lower pair of selection transistors coinciding with another output of the voltage regulator; and
   a single bootstrap capacitor having a first terminal that connects to the reference supply voltage through the first upper pair of selection transistors, and a second terminal that connects to ground through the second lower pair of selection transistors.

3. The output stage of claim 2, wherein the selection transistors of the upper pair are complementary MOS type and have their drain terminals in common to form a first output terminal of the voltage regulator, and wherein each selection transistor of the upper pair has a gate terminal to receive a respective selection control signal.

4. The output stage of claim 2, wherein the selection transistors of the lower pair are the complementary MOS type and have their drain terminals in common to make up a second output terminal of the voltage regulator, and wherein each selection transistor of the lower pair has a gate terminal to receive a respective selection control signal.

5. The output stage of claim 4, wherein voltage regulator further includes:
a first upper drive transistor and a second upper drive transistor, wherein the first and second upper drive transistors have their drains terminals in common, wherein the first terminal of the bootstrap capacitor is further connected to the common drain terminals of the first and second upper drive transistors, wherein the first and second upper drive transistors are insertable in mutual series between the reference supply voltage and ground with the first upper drive transistor having a control terminal connected to an upper drive input terminal to receive a second lower selection signal.

6. The output stage of claim 5, wherein the voltage regulator further includes:
an upper switching transistor having a control terminal connected to the first terminal of the bootstrap capacitor, wherein the second upper drive transistor has a control terminal connected to a first internal circuit node that connects to ground through the upper switching transistor.

7. The output stage of claim 6, wherein the first upper driver transistor is a P-channel MOS transistor, and the upper switching transistor and the second upper driver transistor are N-channel MOS transistors.

8. The output stage of claim 6, wherein the voltage regulator further includes:
a first upper control transistor and a second upper control transistor having their drain terminals in common and connected to the first internal circuit node, wherein the first upper control transistor and the second upper control transistor have control terminals respectively connected to a first upper control terminal and a second upper control terminal, and wherein the first terminal of the bootstrap capacitor connects to the reference supply voltage through the first and second upper control transistors.

9. The output stage of claim 2, further comprising:
a switch designed to hold bulk terminals of P-channel MOS transistors at a voltage equal to a supply voltage when a voltage of the second terminal of the bootstrap capacitor is less than or equal to the supply voltage, wherein the switch establishes an electrical connection with the second terminal of the bootstrap capacitor only during a bootstrap phase of a pull-down transistor of the pair of complementary transistors.

10. The output stage of claim 9, wherein the switch holds bulk terminals of N-channel MOS transistors at a ground voltage value when a voltage of the first terminal of the bootstrap capacitor is greater than or equal to 0 volts, wherein the switch connects the bulk terminals of the N-channel MOS transistors to the first terminal of the bootstrap capacitor only during a bootstrap phase of a pull-up transistor of the pair of complementary transistors.

11. An output stage for an electronic memory device, comprising:
a final stage including:
a pull-up transistor having a first terminal that connects to a first voltage potential, a second terminal and control gate, and
a pull-down transistor having a first terminal connected to the second terminal of the pull-up transistor, a second terminal that connects to a ground potential, and a control gate; and
a voltage regulator having a first output coupled to the control gate of the pull-up transistor, a second output couled to the control gate of the pull-down transistor, and at least one bootstrap capacitor that provides, on the first output, a first voltage that is higher than the first voltage potential, and, on the second output, a second voltage that is lower than the ground potential;
wherein the at least one bootstrap capacitor has a first node coupled to the control gate of the pull-up transistor and a second node coupled to the control gate of the pull-down transistor.

12. The output stage of claim 11, wherein the voltage regulator includes a plurality of switches that operate to charge the at least one bootstrap capacitor during a charging phase, and to discharge the at least one bootstrap capacitor during a discharging phase to provide the first and second voltages.

13. The output stage of claim 11, wherein the voltage regulator includes a plurality of transistors having a plurality of respective bulk terminals, and wherein the output stage further comprises:
a switch circuit coupled to the voltage regulator, that holds at least one of the plurality of respective bulk terminals to the first voltage potential when a voltage at the first node exceeds a first predetermined voltage, and holds at least another of the plurality of respective bulk terminals to the ground potential when a voltage at the second node exceeds a second predetermined voltage.

14. An output stage for an electronic memory device, comprising:
a final stage including:
a pull-up transistor having a first terminal that connects to a first voltage potential, a second terminal and control gate, and
a pull-down transistor having a first terminal connected to the second terminal of the pull-up transistor, a second terminal that connects to a ground potential, and a control gate; and
means for providing a first voltage that is higher than the first voltage potential to the control gate of the pull-up transistor, and a second voltage that is lower than the ground potential to the control gate of the pull-down transistor;
wherein the means for providing includes a first node coupled to the control gate of the pull-up transistor and a second node coupled to the control gate of the pull-down transistor.

15. The output stage of claim 14, wherein the means for providing includes:
means for charging at least one capacitor during a charging phase, and discharging the at least one capacitor during a discharging phase to provide the first and second voltages.

16. The output stage of claim 14, wherein the means for providing further includes a plurality of transistors having a plurality of respective bulk terminals, and wherein the output stage further comprises:

a switch circuit coupled to the voltage regulator, that holds at least one of the plurality of respective bulk terminals to the first voltage potential when a voltage at the first node exceeds a first predetermined voltage, and holds at least another of the plurality of respective bulk terminals to the ground potential when a voltage at the second node exceeds a second predetermined voltage.

17. An output stage comprising:

an output circuit of the pull-up/pull-down type comprised of first and second complementary transistors that are disposed between a primary reference voltage and a secondary reference voltage;

each of said first and second complementary transistors having respective first and second control terminals;

first and second selection transistors;

a voltage booster having a first output connected by way of the first selection transistor to the control terminal of the pull-up transistor, and a second output connected by way of the second selection transistor to the control terminal of the pull-down transistor;

wherein said voltage booster comprises at least one bootstrap capacitor;

wherein the at least one bootstrap capacitor has a first node coupled to the first output of the voltage booster, and a second node coupled to the second output of the voltage booster.

18. The output stage according to claim 17 wherein the voltage booster includes a plurality of transistors having a plurality of respective bulk terminals, and wherein the output circuit further comprises:

a switch circuit coupled to the voltage booster, that holds at least one of the plurality of respective bulk terminals to the primary reference voltage when a voltage at the first node exceeds a first predetermined voltage, and holds at least another of the plurality of respective bulk terminals to the secondary reference voltage when a voltage at the second node exceeds a second predetermined voltage.

19. The output stage according to claim 17, wherein the voltage booster includes a plurality of switches that operate to charge the at least one bootstrap capacitor during a charging phase, and to discharge the at least one bootstrap capacitor during a discharging phase to provide the first and second voltages.

20. The output stage according to claim 17, wherein the first selection transistor biases the NMOS bulk terminals to a negative voltage value, which value is at a corresponding capacitor terminal, when the pull-up transistor is bootstrapped and to a reference value in all other cases.

21. The output stage according to claim 17, wherein the second selection transistor biases the PMOS bulk terminals to a voltage value higher than a supply voltage, which value is at the corresponding capacitor terminal, when the pull-down transistor is bootstrapped.

22. The output stage according to claim 17, wherein said first selection transistor is an N-channel transistor and said second selection transistor is a P-channel transistor.

23. The output stage according to claim 22, wherein said first selection transistor comprises a first upper pair of selection transistors connected in series and said second selection transistor comprises a second lower pair of selection transistors also connected in series.

24. The output stage according to claim 23, wherein a connection node formed between the transistors of the first pair couples to the control terminal of the pull-up transistor and the connection node formed between the transistors of the second pair of selection transistors couples to the control terminal of the pull-down transistor.

25. An output stage comprising:

an output circuit of the pull-up/pull-down type comprised of first and second complementary transistors that are disposed between a first voltage potential and a second voltage potential;

each of said first and second complementary transistors having respective first and second control terminals;

first and second selection transistors;

means for providing a first voltage that is higher than the first voltage potential by way of the first selection transistor to the first control terminal, and a second voltage that is lower than the second voltage potential by way of the second selection transistor to the second control terminal;

and wherein the means for providing includes means for charging at least one capacitor during a charging phase, and discharging the at least one capacitor during a discharging phase to provide the first and second voltages;

and wherein said at least one capacitor has first and second nodes connected to respective first and second voltages of said means for providing.

26. The output stage according to claim 25, wherein the means for providing further includes a plurality of transistors having a plurality of respective bulk terminals, and wherein the output stage further comprises:

a switch circuit coupled to the means for providing, that holds at least one of the plurality of respective bulk terminals to the first voltage potential when a voltage at the first node exceeds a first predetermined voltage, and holds at least another of the plurality of respective bulk terminals to the second voltage potential when a voltage at the second node exceeds a second predetermined voltage.

* * * * *

UNITED STATES PATENT AND TRADEMARK OFFICE
CERTIFICATE OF CORRECTION

PATENT NO. : 6,215,329 B1
DATED : April 10, 2001
INVENTOR(S) : Giovanni Campardo, Stefano Zanardi and Andrea Ghilardelli It is certified that error appears in the above-identified patent and that said Letters Patent is hereby corrected as shown below:

Column 6,
Line 6, should read:

$$Qi = CboostN \cdot Vcc \qquad (4.1)$$

Signed and Sealed this

Twenty-fifth Day of September, 2001

Attest:

NICHOLAS P. GODICI
Attesting Officer
Acting Director of the United States Patent and Trademark Office